June 8, 1965 H. TRIGGER ETAL 3,188,252
METHOD OF PRODUCING A BROAD AREA FUSED JUNCTION IN A SEMICONDUCTOR BODY
Filed Nov. 20, 1961 2 Sheets-Sheet 1

INVENTORS.
HENRY TRIGGER,
ROBERT A. KOSA,
BY THEIR ATTORNEYS
Spensley & Horn.

HENRY TRIGGER,
ROBERT A. KOSA,
INVENTORS.

BY THEIR ATTORNEYS.
Spensley & Horn.

United States Patent Office 3,188,252

Patented June 8, 1965

3,188,252
METHOD OF PRODUCING A BROAD AREA FUSED JUNCTION IN A SEMICONDUCTOR BODY

Henry Trigger, Monterey Park, and Robert A. Kosa, Los Angeles, Calif., assignors to TRW Semiconductors, Inc., Lawndale, Calif., a corporation of Delaware Filed Nov. 20, 1961, Ser. No. 153,455
5 Claims. (Cl. 148—184)

This invention pertains to the fabrication of semiconductor devices and more particularly to a method for alloying a metallic foil to a semiconductor body to create an ohmic contact thereto or a planar junction therein.

In the semiconductor art, a region of semiconductor material containing an excess of donor impurities and yielding an excess of free electrons is considered to be an impurity-doped N type region. An impurity-doped P type region is one containing an excess of acceptor impurities resulting in a deficit of electrons, or an excess of holes. Stated differently, an N type region is one characterized by electron conductivity, whereas a P type region is one characterized by hole conductivity. A normally doped region is one having the minimum concentration of active impurity required to determine the conductivity type. A heavily doped region of N type conductivity is commonly referred to as an $N^+$ region, the + indicating that the concentration of the active impurity in the region is greater than the minimum required to determine the conductivity type. Similarly, a $P^+$ type region indicates a heavily doped region of P type conductivity.

When a continuous, solid crystal specimen of semiconductor material has an N type region adjacent to a P type region, the boundary between them is termed a PN (or NP) junction. It is often desirable to provide a non-rectifying junction or ohmic contact to a semiconductor material. When a P type starting crystal such as silicon, for example, of a given resistivity has acceptor impurity atoms introduced therein, a P type region of a different resistivity is produced. The gradation between these two regions is what has herein been termed a non-rectifying junction and may be useful in producing an ohmic contact. The term "junction," therefore, for the purposes of this invention, is intended to include both rectifying and non-rectifying junctions. The terms "$PP^+$" junction and "$NN^+$" junction are typically used to denote a non-rectifying junction depending upon whether it is made to a P type conductivity or N type conductivity crystal.

The term "semiconductor material," as utilized herein, is considered generic to both germanium and silicon, and is employed to distinguish these semiconductors from metallic oxide semiconductors such as copper oxide.

The term "active impurity" is utilized herein to denote those impurities which affect the electrical rectification characteristics of semiconductor material as distinguished from other impurities which have no appreciable effect upon these characteristics. Active impurities are ordinarily classified either as donor impurities such as phosphorus, arsenic, and antimony, or as acceptor impurities, such as boron, aluminum, gallium, and indium.

In the prior art, junction semiconductor devices have been produced by fusing small amounts of a low melting point, active impurity within a portion of a semiconductor starting specimen. According to this prior art method, a specimen of a suitable active impurity substance is placed in contact with the semiconductor body and heated to a temperature above the melting point of the active impurity, but below the melting point of the semiconductor crystal, in order to melt the active impurity and dissolve therein a portion of the adjacent semiconductor material. Upon cooling, the dissolved atoms of semiconductor material and active impurity are regrown onto the semiconductor material, thereby producing an impurity-saturated region in the semiconductor specimen. The active impurity substance should have a relatively low melting point or at least a low eutectic temperature with the semiconductor material so that fusion can be readily effected without raising the temperature of the semiconductor body to values which might result in injury to the electrical characteristics of the semiconductor body. A typical example of this prior art technique is the fusion of an aluminum button to an N type silicon crystal body to produce therein a fused PN junction.

Another well known prior art method of forming a fused junction is an evaporative technique wherein a mass of the active impurity substance is evaporated onto the surface of the semiconductor body to form a molten layer of substantial thickness upon the surface of the body to dissolve a layer of the surface of the semiconductor body in the molten layer of active impurity substance. The semiconductor body is then cooled to thereby cause the dissolved semiconductor material to reprecipitate, together with some atoms of the active impurity, upon the semiconductor body to form an integral regrown crystal region of opposite conductivity type or differing active impurity concentration within the semiconductor body.

The various semiconductor fusion techniques are based upon the creation, on the surface of a semiconductor body, of a molten layer containing atoms of an active impurity substance and atoms of the semiconductor material, crystal regrowth occurring upon cooling of the molten layer and the semiconductor body. In order to produce a uniform junction, the molten layer must be of constant thickness over the semiconductor surface, the amount of alloy on the semiconductor surface resulting in predeterminable junction characteristics. Hence, close control of the amount of molten alloy from which to regrow is necessary to produce a uniform junction of desired characteristics.

Both of the aforementioned button fusion and evaporative fusion techniques are very difficult to control and it is practically impossible to obtain a uniform, planar junction by the exercise of these processes. The button fusion technique does not produce a uniform junction and suffers from the additional disadvantage that individual handling of each semiconductor device is necessary during the fusion process. In the evaporative technique, there is uncertain wetting and alloying, and the metal applied to the semiconductor surface is of uneven thickness. Hence, both of these prior art techniques lack the characteristic of reproducibility, i.e., they cannot be relied upon to repeatedly produce substantially identical fused junctions under unvarying operating conditions. Therefore, neither of the aforementioned generally utilized prior art fusion methods are very well suited for use with mass production techniques.

It is therefore an object of the present invention to provide an improved method and apparatus for creating a fused junction in a body of semiconductor material.

It is also an object of the present invention to provide an improved method and apparatus for producing an ohmic contact to a semiconductor body.

It is another object of the present invention to provide an improved method and apparatus for fabricating fused junction semiconductor devices.

It is still another object of the present invention to provide a method and apparatus suitable for the mass production of fused junction semiconductor devices.

It is a further object of the present invention to provide a method and apparatus capable of repeatedly producing substantially identical fused junctions in semiconductor bodies.

It is a still further object of the present invention to provide a method and apparatus capable of repeatedly producing substantially identical ohmic contacts to semiconductor bodies.

It is another object of the present invention to provide a relatively simple and rapid method and apparatus for producing fused junctions in semiconductor bodies.

It is yet another object of the present invention to provide a method and apparatus for producing uniform fused junctions in semiconductor bodies.

It is a further object of the present invention to provide a method and apparatus for forming broad area, planar, fused junctions in semiconductor bodies.

It is a still further object of the present invention to provide a method and apparatus for producing fused junctions in semiconductor bodies, the method and apparatus providing uniform alloying.

The present invention comprises a foil fusion technique in which the smooth, planar surface of the semiconductor body is uniformly urged with a predetermined pressure against a metallic foil containing a suitable active impurity, the resulting sandwich being heated to cause alloying. The fusion is performed in an apparatus wherein the metallic foil is disposed upon a planar heat conductive surface of a material which will not wet with the alloy to be formed. The apparatus is so constructed and arranged that the semiconductor body is urged against the metallic foil with a predetermined pressure during heating until a predetermined sandwich thickness is achieved, the predetermined sandwich thickness, and hence the molten layer thickness, being maintained during completion of the alloying to thereby result in a uniform, planar junction. In the presently preferred embodiment of apparatus suitable for performing the method of the present invention, heat is applied to a heating plate of a material characterized by high heat conductivity. The heating plate is sufficiently large so as to accommodate a plurality of semiconductor bodies thereon to simultaneously produce an identical junction in each body. Each of the semiconductor bodies is disposed upon a metallic foil within a multi-part support assemblage constructed of a heat conductive material which will not wet with the alloy to be formed upon heating of the sandwich. The support assemblage consists of a bottom plate upon which is mounted a spacer having a central aperture therein, and a top plate. The central aperture in the spacer is slightly larger than the semiconductor body to provide for the flow of molten alloy upon compression of the sandwich contained therein, the thickness of the spacer being a predetermined distance less than the starting combined thicknesses of the semiconductor body and the metallic foil. Mounted above the heating plate by a suitable supporting framework are a plurality of vertically oriented, selectively adjustable, helical springs. The heating plate and the spring-supporting framework are enclosed in a housing adapted for the maintenance of a reducing atmosphere therein.

To prepare the apparatus for operation, the spacer is positioned upon the bottom plate of the support assemblage and a suitable metallic foil disposed upon the bottom plate at the bottom of the aperture in the spacer. A semiconductor wafer is then disposed upon the metallic foil within the aperture and the top plate is then placed in position upon the upper surface of the semiconductor body. The resulting assemblage is then placed upon the heating plate directly beneath one of the helical springs and the end of the spring placed in contact with the upper surface of the top plate, the spring-supporting framework then being adjusted to compress the spring with a predetermined force. A desired atmosphere is then created within the housing and the heating plate is heated to a predetermined temperature sufficient to cause alloying of the metallic foil with the semiconductor material. Upon occurrence of alloying, the pressure of the spring will compress the semiconductor body toward the bottom plate of the support structure until the top plate of the support structure contacts the upper surface of the spacer to establish the desired sandwich thickness at the predetermined thickness of the spacer, the compression of the sandwich resulting in a constant, uniform layer of molten alloy beneath the lower surface of the semiconductor body with excess alloy being squeezed out into the space between the semiconductor body and the interior surfaces of the spacer. The use of a metallic foil of uniform thickness allows consistent involvement of the semiconductor material and the use of the spacer type support structure of predetermined thickness furnishes a predetermined unvarying amount of molten material in the form of a liquidus alloy from which to regrow. The combination of these two features results in maintenance of a uniform sandwich thickness during alloying and enables the repetitive production of substantially identical planar junctions, thereby resulting in a method and apparatus suitable for application in mass production techniques.

The novel features which are believed to be characteristic of the invention, both as to its organization and method of operation, together with further objects and advantages thereof will be better understood from the following description considered in connection with the accompanying drawing, in which a presently preferred embodiment of the invention is illustrated by way of example. It is to be expressly understood, however, that the drawing is for the purpose of illustration and description only, and is not intended as a definition of the limits of the invention.

Figure 1:
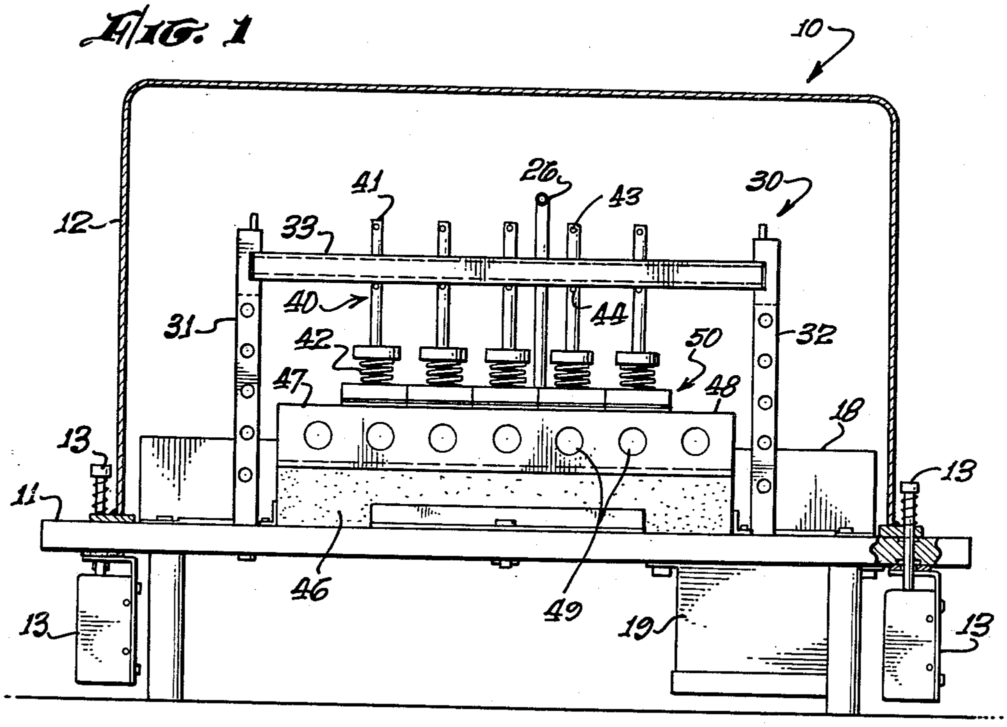
FIGURE 1 is a side view, partly in section, of apparatus suitable for performance of the method of the present invention.
Figure 2:
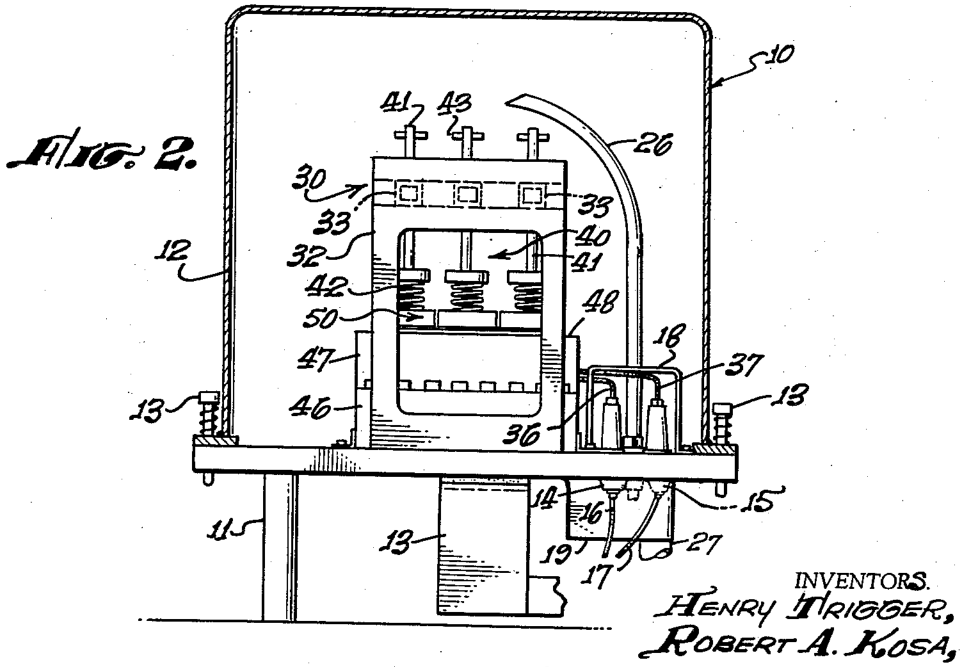
FIGURE 2 is an end view, partly in section, of the apparatus of FIGURE 1.
Figure 3:
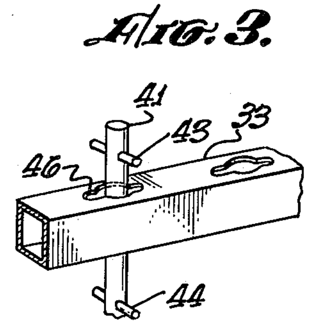
FIGURE 3 is a perspective view showing a portion of the supporting framework of the apparatus of FIGURES 1 and 2.

Turning now to the drawing, in FIGURES 1 and 2, there are shown views of an apparatus suitable for the performance of the method of the present invention. The apparatus consists of a housing generally indicated by the reference numeral 10, a supporting framework generally indicated by the reference numeral 30 and a semiconductor support structure generally indicated by the reference numeral 50. The housing 10 consists of a table 11 and a cover 12 detachably mounted thereto by fasteners 13. Extending through the upper surface of the table 11, and sealed thereto, are a pair of feed-through insulators 14 and 15, as can best be seen in FIGURE 2. Connected to the lower terminals of the feed-through insulators 14 and 15 are electrical leads 16 and 17, respectively. The electrical leads 16 and 17 are connected to a source of electrical current, not shown. The upper terminals of the feed-through insulators 14 and 15 are connected to an electrical heater within the housing 10, in a manner to be explained hereinbelow. Mounted to the upper surface of the table 11, as shown, is a shield cover 18 to protect the upper terminals of the feed-through insulators 14 and 15. A shield cover 19 is mounted to the underside of the table 11, as shown, to protect the lowermost terminals of the feed-through insulators 14 and 15. Projecting through the surface of the table 11, and sealably mounted thereto, is an inlet pipe 26 and an outlet pipe 27. The inlet pipe 26 and the outlet pipe 27 are coupled to a suitable pumping system, not shown, to enable creation of a desired atmosphere within the housing. The supporting framework 30 is mounted to the upper surface of the table 11 within the housing 10. The supporting framework 30 consists of a pair of mounting posts 31 and 32, a series of crossbars 33 supported in horizontal alignment by the mounting posts 31 and 32, and a series of plunger assemblies, indicated generally by the reference numeral 40, mounted to each of the crossbars 33. Each of the plunger assemblies 40 consists of an elongate plunger rod 41, a helical spring 42 axially mounted to one end of the plunger rod 41, and spaced apart stop bars 43 and 44 mounted transversely to the plunger rod 41 near the other end thereof. As can best be seen from FIGURE 3, the plunger rods 41 are vertically mounted through an irregularly shaped hole 46 in the crossbars 33, the irregularly shaped hole 46 having a circular central portion and elongate diametrically opposite projecting portions to clear the stop bars 43 and 44. By rotation of the plunger rods 41 to the position shown in FIGURE 3 with the stop bars 43 and 44 in perpendicular alignment to the elongate projections on the irregularly shaped hole 46 and the crossbars 33, it is seen that the plunger rods 41 will be slidably retained to the crossbars 33.

Figure 4:
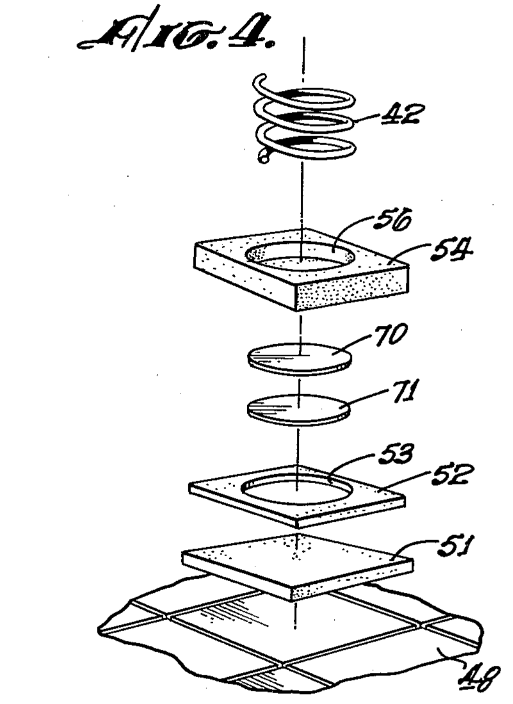
FIGURE 4 is an exploded view showing a support structure used for mounting semiconductor bodies in the apparatus of FIGURES 1 and 2.

Mounted to the upper surface of the table 11, between the mounting posts 31 and 32 and beneath the crossbars 33 is a block 46 of refractory material. Disposed atop the refractory block 46 is an electrical heating plate 47 having a planar upper surface 48. The electrical heating plate 47 provides an even distribution of heat across its upper surface 48. Such types of heaters are well known in the art and hence will not be discussed in detail. An example of such a heater is a block of highly heat conductive material having a plurality of electrical cartridges disposed in apertures therein or having a resistance wire heating element disposed along a sinuous passageway or groove therein. In the illustrated embodiment, a plurality of cartridge type heaters 49 are utilized. Electrical connection to the cartridge heaters 49 is provided by the electrical leads 36 and 37 connected to the feed-through insulators 14 and 15, respectively. The upper surface 48 of the electrical heating plate 47 may be scored with indicating marks to facilitate alignment of the support structures 50 directly beneath the plunger assemblies 40. In the illustrated embodiment, a rectangular grid pattern is scored upon the upper surface 48 of the heating plate 47, as indicated in FIGURE 4. It is apparent that the electrical heating plate 47 must be constructed of a material having a melting point significantly higher than the temperature at which the alloying process is to be performed. For example, if it is desired to create a PN junction in a silicon semiconductor crystal of N type conductivity by using an aluminum metallic foil, the electrical heating plate 47 may be constructed of copper.

Each of the support structures 50 is constructed of a heat conductive material which will not wet with the alloy to be formed of the semiconductor and metallic foil materials utilized to form the fused junction in the semiconductor body at the temperature required for fusion. As can be seen from FIGURE 4, the support structures 50 of the illustrated embodiment are for use with a disc-shaped semiconductor wafer 70. Each of the support structures 50 consists of a rectangular bottom plate 51, a rectangular spacer 52 having a central circular aperture 53 therethrough, and a rectangular top plate 54 having a central circular recess 56 therein. The lateral dimensions of the bottom plate 51 substantially correspond but slightly smaller than the dimensions of the rectangular grid scored upon the upper surface 48 of the electrical heating plate 47 to permit accurate alignment of the support structures 50 beneath a plunger assembly 40 without having adjoining plates 51 touching. The lateral dimensions of the spacer 52 and the top plate 54 are of the same lateral dimensions but smaller than the dimensions of the bottom plate 51 to provide spacing between the spacers 52 and top plates 54 of adjacent support structures to avoid undesirable lateral heating effects therebetween. The spacer 52 is of a predetermined thickness corresponding to the ultimately desired sandwich thickness which is determined by the desired characteristics of the fused junction to be formed in the semiconductor wafer 70. The thickness of the spacer 52 and the trueness of the planar contacting surfaces of the various elements of the support structures 50 are very important in that in order to insure reproducibility of the process. The exterior shapes of the various elements of the support structures are otherwise uncritical, the shape of the apertures 53 being determined in accordance with the shape of the semiconductor bodies, which may be rectangular or of any other commonly used shape. Each of the support structures 50 must be identical when utilizing an identical series of semiconductor wafers and metallic foil. In the illustrated embodiment, it is desired to produce a uniform, planar PN junction within a silicon crystal wafer of N type conductivity utilizing an aluminum foil as the source of acceptor impurity. The disc-shaped semiconductor wafer 70 is a silicon crystal wafer of N type conductivity having a thickness of 5½ mils and a diameter of ⅝ inch. The metallic foil disc 71 is cut from an aluminum foil sheet of 5 mils thickness, the diameter of the disc 71 also being ⅝ inch. To provide desired junction characteristics in this particular application, an ultimate sandwich thickness of 7½ mils is specified, hence the spacer 52 is of a 7½ mil thickness. The diameter of the aperture 53 in the spacer 52 is made one inch to accommodate the flow of molten alloy upon compression of the sandwich from a starting thickness of 10½ mils to a ultimate thickness of 7½ mils. The bottom plates 51, the spacers 52, and the top plates 54 comprising the support structures 50 are fabricated of graphite, a heat conductive material which will withstand the operating temperatures encountered in the fusion of aluminum and silicon and which will not wet with aluminum-silicon alloys.

Figure 5:
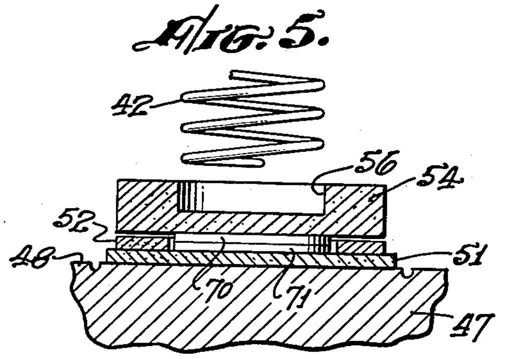
FIGURE 5 is a sectional view, in elevation, of the support structure of FIGURE 4 during one step of the present invention.

To prepare the apparatus of the present invention for use, the cover 12 is removed from the table 11 and the plunger rods 41 of the plunger assemblies 40 are elevated to an upper position by upward movement of the plunger rod 41 while the stop bars 43 and 44 are in alignment with the projecting portions of the apertures 46 and the crossbars 33. When the lower crossbar 44 passes through the aperture 46, the plunger rod 41 is rotated through approximately 90° and the plunger rod lowered until the rod is supported in an upper position by the contact between the stop bar 44 and the crossbar 33. Next, a support structure 50 is assembled beneath each plunger assembly 40. A spacer 52 is positioned upon the bottom plate 51 and an aluminum foil disc 71 is disposed within the aperture 53, the aluminum foil disc 71 resting upon the upper surface of the bottom plate. An N type silicon semiconductor wafer 70 is then disposed at the top of the metallic foil disc 71 and the top plate 54 then positioned on the upper surface of the semiconductor wafer 70. The resulting assemblage is positioned directly beneath the lower end of the helical spring 42 of a plunger assembly 40, the resulting assemblage being shown in FIGURE 5. Since the plunger assembly 40 is supported in an uppermost position, the bottom of the helical spring 42 will not contact the upper plate 54 and the support structure assemblages may be easily moved about the surface 48 of the electrical heating plate 47.

Figure 7:
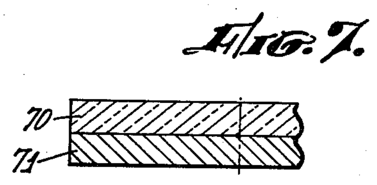
FIGURE 7 is an elevational view showing the relative thicknesses of the semiconductor body-metallic foil sandwhich mounted in the support structure at the production stage illustrated by FIGURE 5; and, FIGURE 8 is an elevational view illustrating the resulting fused junction structure formed in accordance with the present invention method and apparatus.
Figure 6:
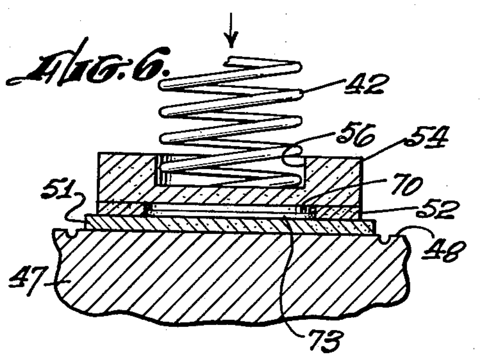
FIGURE 6 is a sectional view, in elevation, showing the support structure of FIGURE 4 in a subsequent step of the process of the present invention.

Upon alignment of a support structure 50, containing a semiconductor wafer 70 and the metallic foil disc 71 beneath the plunger assembly 40, that plunger assembly 40 is lowered by rotation of the plunger rod 41 until the stop bars 43 and 44 are again in alignment with the projection on the apertures 46 and the crossbars 33. The plunger assembly 40 is then urged downward until the lower end of the helical spring 42 seats within the recess 56 in the upper plate 54 of the support structure 50, and the plunger rod 41 is urged downward still further to cause compression of the spring 42, the helical spring 42 providing a compressive force of about 7 pounds. The plunger assembly 40 is then locked in a lower position by the downward passage of the lower stop bar 44 through the aperture 46 and a subsequent rotation of the plunger rod 41 to a position wherein the upper surface of the lower stop bar 44 is in contact with the lower surface of the crossbar 33 (see FIGURE 1). In this lowermost position, the helical spring 42 is compressed, thereby urging the semiconductor wafer 70 against the metal foil disc 71 since the spacer 52 is of a predetermined thickness less than combined thicknesses of the wafer 70 and the foil 71, the resulting sandwich structure being shown in FIGURE 7. The cover 12 is then installed and sealed to the upper surface of the table 11 by fasteners 13. Since silicon surfaces are subject to rapid oxidation, it is desired to carry out the fusion process in a reducing or non-oxidizing atmosphere. Hence, a nitrogen atmosphere is then created within the housing 10 by actuation of a suitable pumping system coupled to the pipes 26 and 27, the nitrogen atmosphere being pumped into the housing 10 through the inlet pipe 26 and exhausted through the outlet pipe 27. The nitrogen pressure is not critical, a pressure of just over 1 p.s.i. being presently preferred. The electrical cartridge heaters 49 are energized by connection to a suitable source of electricity through the electrical leads 16 and 17 and the heaters elevated to a temperature of about 725° C. by control of the electrical current. Upon softening of the metallic foil 71 during the alloying process, the downward force exerted by the compressed spring 42 will force the top plate 54 downward until it rests upon the upper surface of the spacer 52 (see FIGURE 6), thereby squeezing the sandwich then consisting of the semiconductor wafer and the liquidus alloy 73 to the predetermined 7½ mil thickness where it is there maintained throughout the rest of the alloying process, an alloying time of about 3 minutes having been found sufficient at process temperatures near 725° C. As the top plate 54 moves downward in response to the force exerted by the helical spring 42, some of the liquidus alloy is squeezed out from between the bottom plate 51 and the lower surface of the semiconductor disc 70, the squeezed out alloy flowing into the space between the peripheral side surface of the semiconductor disc 70 and the interior surface defining the aperture 53 in the spacer 52. The top plate 54 moves downward until it seats upon the upper surface of the spacer 52 to thereby maintain a constant, controlled thickness of silicon-saturated molten aluminum beneath the lower surface of the semiconductor wafer 70 during alloying, the negligible weight of the semiconductor wafer 70 causing no significant compressive effect. This careful control of the amount of molten alloy from which to regrow results not only in a uniform, planar junction but also in junction reproducibility. As mentioned hereinabove, junction characteristics depend in a known manner upon the amount of liquidus alloy from which regrowing occurs, hence predetermined junction characteristics can be achieved by use of a proper thickness of the spacers 52.

Upon completion of the alloying process, the electrical leads 16 and 17 are disconnected from the source of electrical current. At this point, maintenance of a reducing atmosphere within the housing 10 is no longer necessary and, upon cooling, the cover 12 is removed and the plunger assemblies 40 raised to the aforementioned upper position to allow removal of the support structures 50 from the apparatus.

Figure 8:
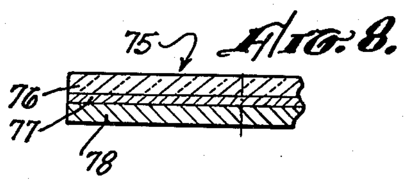

During cooling crystal regrowth occurs from the silicon saturated liquidus alloy; the resulting diode structure being indicated in FIGURE 8 by the reference numeral 75. The structure comprises an uppermost layer 76 of N type silicon (the remaining undissolved portion of the starting wafer 70), an intermediate layer 77 of P type silicon with some atoms of aluminum dispersed therethrough (resulting from silicon regrowth from the liquidus alloy 73), and a lowermost layer 78 of aluminum with some silicon atoms dispersed therethrough. The intermediate region 77 defines the fused PN junction and, although definite boundaries between the regions 76, 77 and 78 do not exist, they are indicated on the drawing in a general manner for purpose of illustration.

Upon removal of the diode wafers 75 from the support structures 50, each wafer is diced into a plurality of smaller wafers in accordance with standard techniques in the art. Each die will have an identical, uniform, fused PN junction of predetermined characteristics.

Thus, there has been hereinabove, described a foil fusion technique for producing uniform, planar fused junctions in bodies of semiconductor material. Performance of the technique with the disclosed apparatus results in the repetitive production of substantially identical junctions of uniform thickness for identical semiconductor bodies and foil sheets. Due to the creation of uniform junctions and the reproducibility of the process utilizing the described apparatus, it is apparent that the present invention is particularly suited for the mass production of semiconductor devices. Substantially identical, uniform junctions can be simultaneously produced in a plurality of semiconductor wafers, each of the wafers then being diced to form a plurality of semiconductor bodies having identical junctions therein. Although the invention has been described with a certain degree of particularity, it is understood that the present disclosure had been made only by way of example and that numerous changes in the details of construction and the combination and arrangement of parts may be resorted to without departing from the spirit and the scope of the invention as hereinafter claimed. Although specific semiconductor and metallic materials were specified in the illustrated example to form a PN junction, it is apparent that other suitable materials can be selected to form either rectifying or non-rectifying junctions. For example, gold foil may be fused to silicon to provide an ohmic contact to a semiconductor body. The gold foil may be doped with an active impurity of the same conductivity type as the semiconductor surface, if desired, to produce an extremely low resistance non-rectifying junction. The fusion temperature would be on the order of 370° C. (the silicon-gold eutectic temperature) and would permit the use of an electrical heating plate constructed of aluminum. Furthermore, although the foil in the illustrated example was itself the active impurity, it is within the purview of the present invention to utilize a foil substance, not necessarily metallic, doped with the active impurity atoms. The active impurity atoms may be of one type or may be combinations of different types of active impurity elements.

What is claimed is:

1. A method of producing a broad area fused junction in a semiconductor crystal body comprising the steps of:

(a) disposing a metal foil upon a horizontal heat conductive surface, said metal foil containing atoms of an active impurity and being laterally free of restraint;

(b) disposing a semiconductor crystal body upon said metal foil to thereby form a semiconductor-foil sandwich;

(c) urging said crystal body and said heat conductive surface toward each other while uniformly heating them sufficiently to alloy the metal to the semiconductor crystal body, said heating being to a temperature below the melting point of the semiconductor material whereby molten alloy is squeezed outwardly and said crystal body and said heat conductive surface are moved toward each other;

(d) arresting movement of said heat conductive surface and said crystal body toward each other after movement through a distance less than the thickness of said metal foil prior to heating; and (e) maintaining said heat conductive surface and said crystal body at the distance apart achieved after arresting of said movement while said semiconductor crystal body and metal are cooling, whereby the thickness of said semiconductor crystal body and alloyed metal is less than the combined thickness of said metal foil and semiconductor crystal body prior to heating.

2. The method of claim 1, and further including the step of disposing a second horizontal heat conductive surface upon said semiconductor crystal body.

3. The method of claim 1, wherein said body is a wafer having planar substantially parallel upper and lower surfaces.

4. The method of claim 1, said body being silicon and said metal foil being substantially aluminum.

5. The method of claim 1, said urging being a resilient urging.

References Cited by the Examiner

UNITED STATES PATENTS

| | | | |
|---|---|---|---|
| 2,183,300 | 12/39 | Zeidler | 266—5 |
| 2,258,431 | 10/41 | Wellman | 266—5 |
| 2,960,419 | 11/60 | Emeis | 148—184 |
| 2,994,627 | 8/61 | Roka | 148—184 |
| 3,014,819 | 12/61 | Hunter | 148—1.5 |
| 3,043,722 | 7/62 | Houben et al. | 148—1.5 |
| 3,070,859 | 1/63 | Hamilton | 148—184 |

FOREIGN PATENTS

| | | |
|---|---|---|
| 864,222 | 3/61 | Great Britain. |

BENJAMIN HENKIN, *Primary Examiner.*

DAVID L. RECK, HYLAND BIZOT, *Examiners.*